(12) United States Patent
Yu

(10) Patent No.: US 6,834,095 B2
(45) Date of Patent: Dec. 21, 2004

(54) SHIFT-REGISTER CIRCUIT

(75) Inventor: Jian-Shen Yu, Hsinchu (TW)

(73) Assignee: AU Optronics Corp., Hsinchu (TW)

( * ) Notice: Subject to any disclaimer, the term of this patent is extended or adjusted under 35 U.S.C. 154(b) by 0 days.

(21) Appl. No.: 10/754,805

(22) Filed: Jan. 9, 2004

(65) Prior Publication Data

US 2004/0234020 A1 Nov. 25, 2004

(30) Foreign Application Priority Data

May 22, 2003 (TW) ........................................ 92113823 A

(51) Int. Cl.$^7$ ............................................. G11C 19/00
(52) U.S. Cl. ............................ 377/71; 377/69; 377/79; 345/99; 345/100
(58) Field of Search ............................ 377/69, 71, 79; 345/99, 100

(56) References Cited

U.S. PATENT DOCUMENTS 3,610,951 A  * 10/1971 Howland ..................... 377/79
4,084,106 A    4/1978 Ullrich ........................ 307/221

* cited by examiner

Primary Examiner—Margaret R. Wambach
(74) Attorney, Agent, or Firm—Thomas, Kayden, Horstemeyer & Risley

(57) ABSTRACT

A shift-register circuit comprises an inverter and first to fourth transistors. The first transistor includes a gate coupled to an inverse clock signal, and a first source/drain coupled to a signal output from a previous-stage shift-register unit. The inverter includes a first input terminal coupled to the first source/drain of the first transistor. The second transistor includes a gate coupled to a second source/drain of the first transistor, a first source/drain coupled to a clock signal, and a second source/drain coupled to an output terminal. The third transistor includes a gate coupled to a first output terminal of the inverter, a first source/drain coupled to the output terminal, and a second source/drain coupled to a first voltage. The fourth transistor includes a gate coupled to a signal output from a next-stage shift-register unit, a first source/drain coupled to the output terminal, and a second source/drain coupled to the first voltage.

21 Claims, 5 Drawing Sheets

SHIFT-REGISTER CIRCUIT

BACKGROUND OF THE INVENTION

1. Field of the Invention

The present invention relates to a shift-register circuit, and more particularly, to a shift-register circuit for a liquid crystal display.

2. Description of the Related Art

FIG. 1 shows a conventional shift-register circuit as disclosed by U.S. Pat. No. 4,084,106 of Ullrich in 1978. FIG. 1 shows only a single shift-register unit, although a plurality of shift-register units comprises a shift-register circuit. An inverse clock signal XCK is coupled to the gate of three NMOS transistors Q1~Q3. Each of the NMOS transistors Q1~Q3 has a gate capacitor Cg.

The dynamic power loss of the inverse clock signal is obtained as follows:

$$P = fcv^2;$$

wherein P is dynamic power loss, f is the frequency of the inverse clock signal, c is the total parasitic capacitance on the clock bus, and the v is the voltage swing of the inverse clock signal, where the total capacitance c includes gate capacitors of transistors coupled to the inverse clock signal. When capacitor Cg increases continuously, the dynamic power loss also increases.

SUMMARY OF THE INVENTION

It is therefore an object of the present invention to provide a shift-register circuit for reducing the number of parasitic capacitors of transistors coupled to a clock signal.

To achieve the above-mentioned object, the present invention provides a shift-register circuit having a plurality of shift-register units connected in serial enabling transmission of a clock signal, an inverse clock signal, and a first voltage. Each shift-register unit comprises, an inverter and first, second, third and fourth transistors. The first transistor includes a gate coupled to the inverse clock signal, and a first source/drain coupled to a signal output from a previous-stage shift-register unit. The inverter includes a first input terminal coupled to the first source/drain of the first transistor. The second transistor includes a gate coupled to a second source/drain of the first transistor, a first source/drain coupled to the clock signal, and a second source/drain coupled to an output terminal. The third transistor includes a gate coupled to a first output terminal of the inverter, a first source/drain coupled to the output terminal, and a second source/drain coupled to the first voltage. The fourth transistor includes a gate coupled to a signal output from a next-stage shift-register unit, a first source/drain coupled to the output terminal, and a second source/drain coupled to the first voltage.

In addition, the present invention provides another shift-register circuit having a plurality of shift-register units connected in serial for a clock signal, an inverse clock signal, and a first voltage. Each shift-register unit comprises, an inverter and first, second, third and fourth transistors. The first transistor includes a gate coupled to the inverse clock signal, and a first source/drain coupled to a signal output from a previous-stage shift-register unit. The second transistor includes a gate coupled to a second source/drain of the first transistor, a first source/drain coupled to the clock signal, and a second source/drain coupled to an output terminal. The inverter includes a first input terminal coupled to the output terminal. The third transistor includes a gate coupled to a first output terminal of the inverter, a first source/drain coupled to the output terminal, and a second source/drain coupled to the first voltage. The fourth transistor includes a gate coupled to a signal output from a next-stage shift-register unit, a first source/drain coupled to the output terminal, and a second source/drain coupled to the first voltage.

The present invention provides another shift-register circuit having a plurality of shift-register units connected in serial for a clock signal, an inverse clock signal, and a first voltage. Each shift-register unit comprises, an inverter, a control device and first, second, third and fourth transistors. The first transistor includes a gate coupled to the inverse clock signal, and a first source/drain coupled to a trigger terminal. The inverter includes a first input terminal coupled to the first source/drain of the first transistor. The second transistor includes a gate coupled to a second source/drain of the first transistor, a first source/drain coupled to the clock signal, and a second source/drain coupled to an output terminal for outputting signals. The third transistor includes a gate coupled to a first output terminal of the inverter, a first source/drain coupled to the output terminal, and a second source/drain coupled to the first voltage. The fourth transistor includes a gate coupled to a reset terminal, a first source/drain coupled to the output terminal, and a second source/drain coupled to the first voltage. The control device controls directs the output signal of the shift-register circuit left or right and comprises a seventh, a eighth, a ninth and a tenth transistors. The seventh transistor includes a gate coupled to a left signal directing the output signal of the shift-register circuit left, a first source/drain coupled to a signal output from a previous-stage shift-register unit, and a second source/drain coupled to the reset terminal. The eighth transistor includes a gate coupled to the left signal, a first source/drain coupled to a signal output from a next-stage shift-register unit, and a second source/drain coupled to the trigger terminal. The ninth transistor includes a gate coupled to a right signal for directing the output signal right, a first source/drain coupled to the output signal output from the previous-stage shift-register unit, and a second source/drain coupled to the trigger terminal. The tenth transistor includes a gate coupled to a right signal, a first source/drain coupled to the output signal output from the next-stage shift-register unit, and a second source/drain coupled to the reset terminal.

The present invention additionally provides another shift-register circuit having a plurality of shift-register units connected in serial enabling transmission of a clock signal, an inverse clock signal, and a first voltage. Each shift-register unit comprises, an inverter, a control device and first, second, third and fourth transistors. The first transistor includes a gate coupled to the inverse clock signal, and a first source/drain coupled to a trigger terminal. The second transistor includes a gate coupled to a second source/drain of the first transistor, a first source/drain coupled to the clock signal, and a second source/drain coupled to an output terminal for outputting signals. The inverter includes a first input terminal coupled to the output terminal. The third transistor includes a gate coupled to a first output terminal of the inverter, a first source/drain coupled to the output terminal, and a second source/drain coupled to the first voltage. The fourth transistor includes a gate coupled to a reset terminal, a first source/drain coupled to the output terminal, and a second source/drain coupled to the first voltage. The control device controls directs the output signal of the shift-register circuit left or right and comprises seventh, eighth, ninth and tenth transistors. The seventh transistor includes a gate coupled to a left signal directing the output signal of the shift-register circuit leftward, a first source/drain coupled to a signal output from a previous-stage shift-register unit, and a second source/drain coupled to the reset terminal. The eighth transistor includes a gate coupled to the left signal, a first source/drain coupled to a signal output from a next-stage shift-register unit, and a second source/drain coupled to the trigger terminal. The ninth transistor includes a gate coupled to a right signal for directing the output signal right, a first source/drain coupled to the output signal output from the previous-stage shift-register unit, and a second source/drain coupled to the trigger terminal. The tenth transistor includes a gate coupled to a right signal, a first source/drain coupled to the output signal output from the next-stage shift-register unit, and a second source/drain coupled to the reset terminal.

BRIEF DESCRIPTION OF THE DRAWINGS

The present invention can be more fully understood by reading the subsequent detailed description and examples with reference made to the accompanying drawings, wherein.

DETAILED DESCRIPTION OF THE INVENTION

The present invention provides a shift-register circuit comprising a plurality of shift-register units. The detailed circuit of the shift-register unit is described in the following embodiments. In addition, the shift-register units of the present invention are composed of the NMOS thin film transistors (TFT) or PMOS thin film transistors. A first voltage VSS is at a low voltage level and a second voltage VDD is at a high voltage level when the transistors of the shift-register units are NMOS TFT. The first voltage VSS is at a high voltage level and a second voltage VDD is at a low voltage level when the transistors of the shift-register units are PMOS TFT. All of the embodiments of the present invention are composed of the NMOS TFTs.

Figure 1:
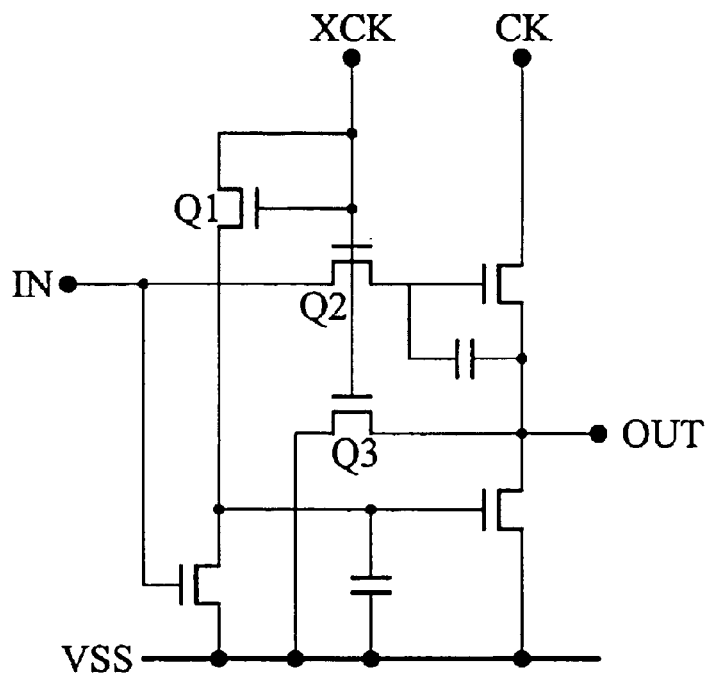
FIG. 1 shows a conventional shift-register circuit.
Figure 2:
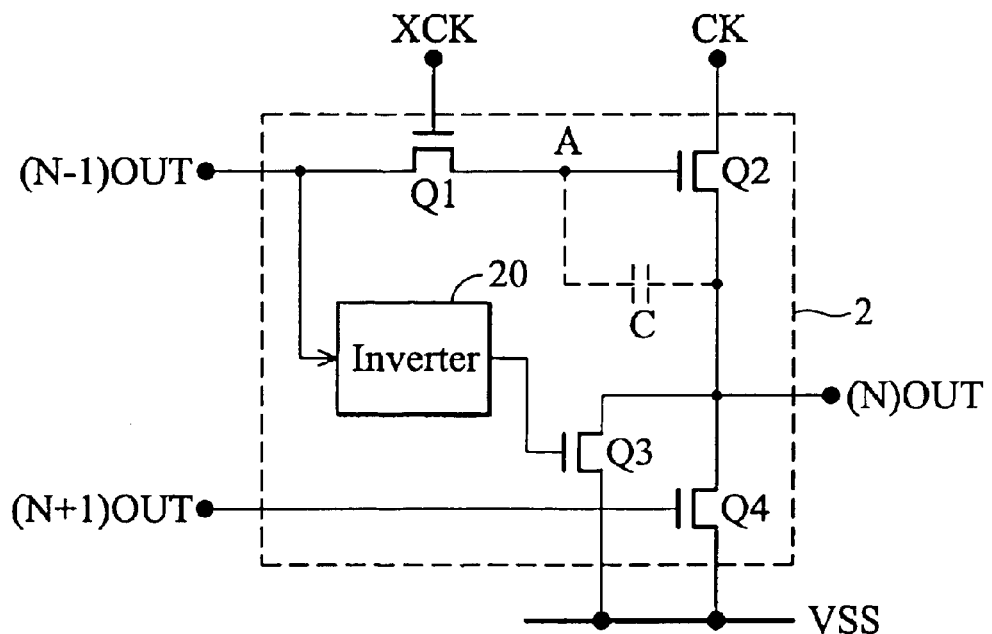
FIG. 2 shows a circuit of the shift-register unit according to the first embodiment of the present invention.

FIG. 2 shows a circuit of the shift-register unit according to the first embodiment of the present invention. FIG. 2 shows only a single shift-register unit, although a plurality of shift-register units comprises a shift-register circuit. For example, the shift-register unit 2 is the (N)th stage of the shift-register circuit.

The gate of the first transistor Q1 is coupled to the inverse clock signal XCK and its first source/drain is coupled to a signal from the output terminal (N−1)OUT of the previous-stage shift-register unit. The input terminal of the inverter 20 is coupled to the first source/drain of the first transistor Q1. The gate of the second transistor Q2 is coupled to a second source/drain of the first transistor Q1, its first source/drain coupled to the clock signal CK and its second source/drain is coupled to an output terminal (N)OUT. The gate of the third transistor Q3 is coupled to an output terminal of the inverter 20, its first source/drain coupled to the output terminal (N)OUT and its second source/drain is coupled to the first voltage VSS. The gate of the fourth transistor Q4 is coupled to an output terminal (N+1)OUT of the next-stage shift-register unit, its first source/drain is coupled to the output terminal (N)OUT, and its second source/drain is coupled to the first voltage VSS. All of the embodiments of the present invention further comprise a capacitor C (shown as a dotted line) for steadying signals output from output terminal (N)OUT.

When the inverse clock signal XCK is at a high voltage level, the first transistor Q1 is turned on. Thus, the previous-stage shift-register unit outputs a high voltage level signal through the first transistor Q1 to turn on the second transistor Q2. Therefore, the output terminal (N)OUT outputs the clock signal to the next-stage shift-register unit.

In addition, the fourth transistor Q4 is switched by the output signal of the next-stage shift-register unit. The output terminal (N)OUT outputs low voltage level signal when the fourth transistor Q4 is turned on.

When the output terminal (N−1)OUT of the previous-stage shift-register unit outputs low voltage level signal to the inverse 20, the inverse 20 outputs a high voltage level signal to the third transistor Q3. Thus, the output terminal (N)OUT is held at the low voltage level.

Figure 3:
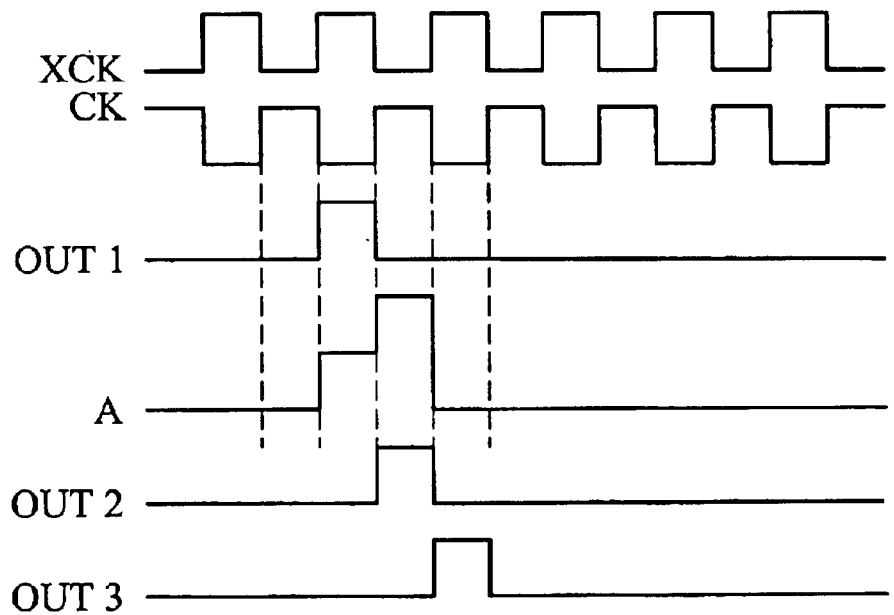
FIG. 3 shows a timing chart of the shift-register circuit according to the embodiment of the present invention.

FIG. 3 shows a timing chart of the shift-register circuit according to the embodiment of the present invention. The output signal OUT1 is output from the output terminal (N−1)OUT of the previous-stage shift-register unit and the output signal OUT2 is output from the output terminal (N)OUT of the shift-register unit 2 and the output signal OUT3 is output from the output terminal (N+1)OUT of the next-stage shift-register unit. As shown in FIG. 3, each shift-register unit of the shift-register circuit according to the embodiment of the present invention outputs a pulse after the previous stage shift-register unit outputs a pulse in a predetermined period. Thus, the requirement of the shift-register circuit is achieved.

When the first transistor Q1 is turned on, the voltage level of a point A and the output signal OUT1 are almost equal with a difference of the transistor threshold voltage. When the inverse clock signal XCK is at a low voltage level, the point A is in a floating state. Using the feed-though voltage drop theorem, the voltage difference between the gate and the first source/drain of the second transistor Q2 is held steady. The point A is at a higher voltage level when the clock signal CK is at a high voltage level.

Figure 4:
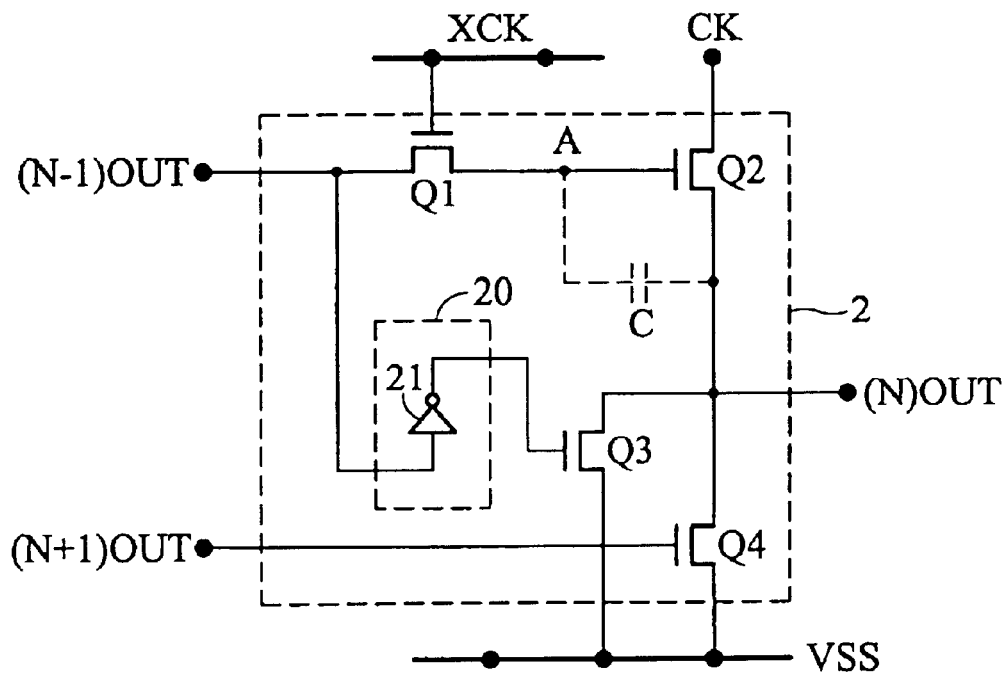
FIG. 4 shows a circuit of the shift-register unit according to the second embodiment of the present invention.

FIG. 4 shows a circuit of the shift-register unit according to the second embodiment of the present invention. As shown in FIG. 4, the inverse 20 is an inverter 21 having an input terminal coupled to the first source/drain of the first transistor Q1, and an output terminal coupled to the gate of the third transistor Q3.

Figure 5:
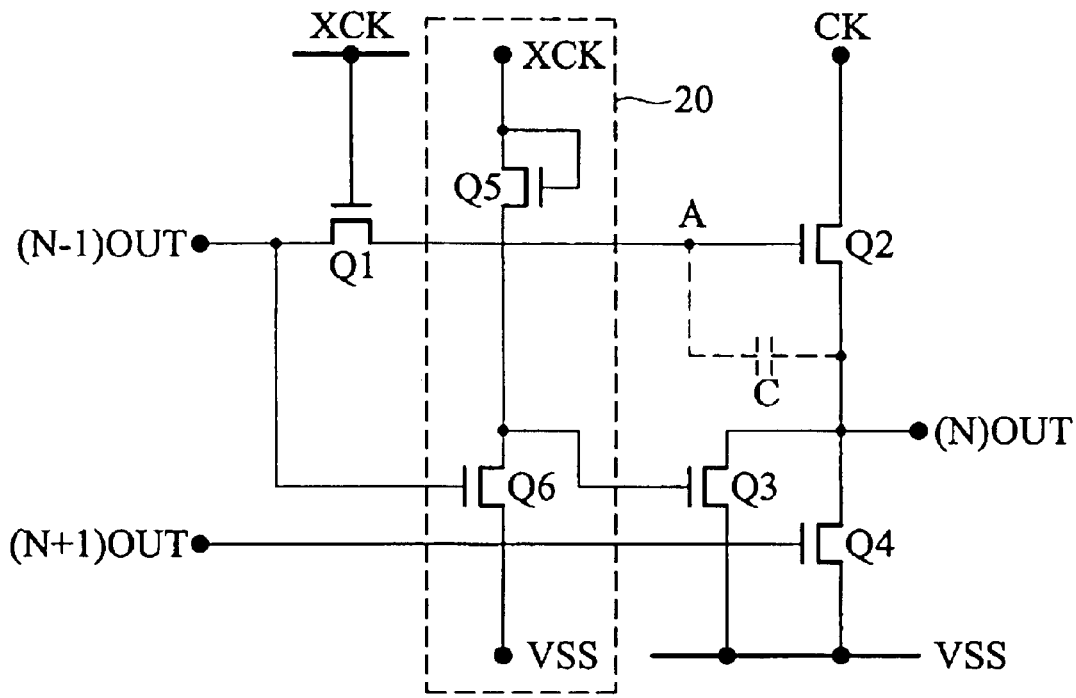
FIG. 5 shows a circuit of the shift-register unit according to the third embodiment of the present invention.

FIG. 5 shows a circuit of the shift-register unit according to the third embodiment of the present invention. As shown in FIG. 5, a fifth transistor Q5 and sixth transistor Q6 compose the inverse 20. The fifth transistor Q5 includes a gate and first source/drain coupled to the inverse clock signal XCK, and a second source/drain coupled to the gate of the third transistor Q3. The sixth transistor Q6 includes a gate coupled to the first source/drain of the first transistor Q1, a first source/drain coupled to the gate of the third transistor Q3, and a second source/drain coupled to the first voltage VSS.

Figure 6:
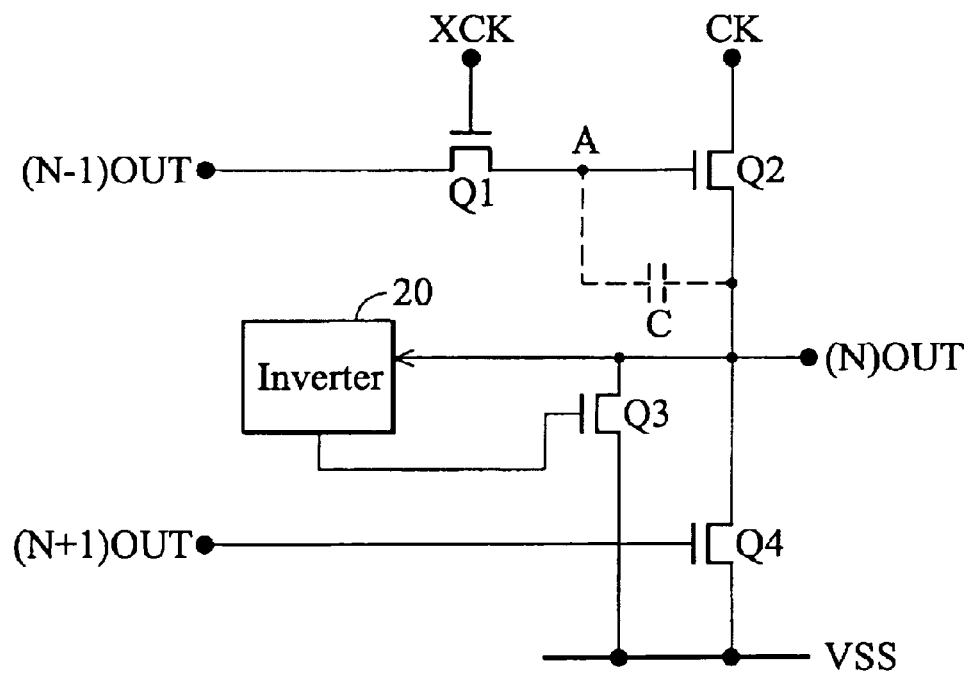
FIG. 6 shows a circuit of the shift-register unit according to the fourth embodiment of the present invention.

FIG. 6 shows a circuit of the shift-register unit according to the fourth embodiment of the present invention. As shown in FIG. 6, the inverse 20 includes an input terminal coupled to the output terminal (N)OUT of the shift-register unit 2, and an output terminal coupled to the gate of the third transistor Q3.

Figure 7:
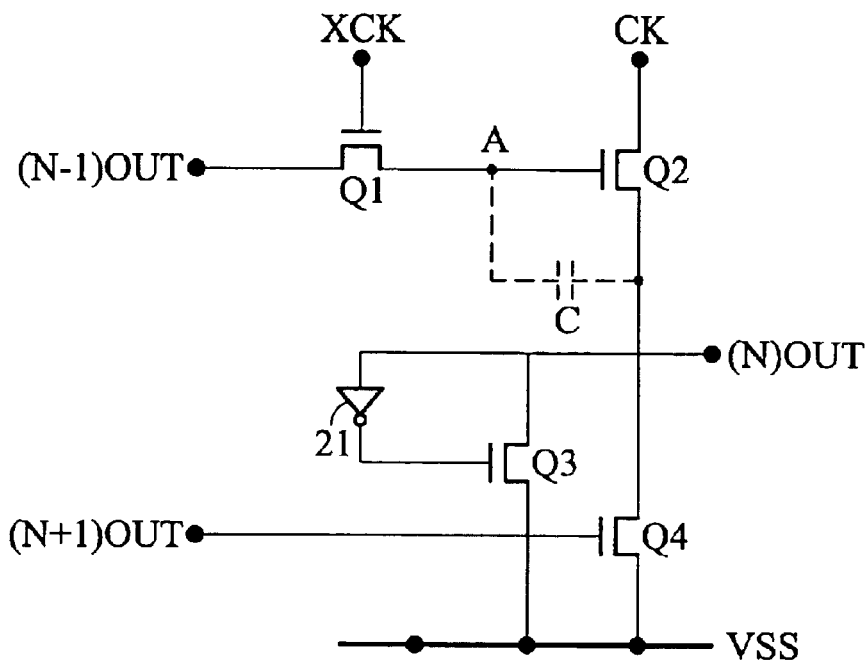
FIG. 7 shows a circuit of the shift-register unit according to the fifth embodiment of the present invention.

FIG. 7 shows a circuit of the shift-register unit according to the fifth embodiment of the present invention. As shown in FIG. 7, the inverse 20 is an inverter 21 having an input terminal coupled to the output terminal (N)OUT of the shift-register unit 2, and an output terminal coupled to the gate of the third transistor Q3 for holding the output signal of the output terminal (N)OUT of the shift-register unit 2 is at a low voltage level.

Figure 8:
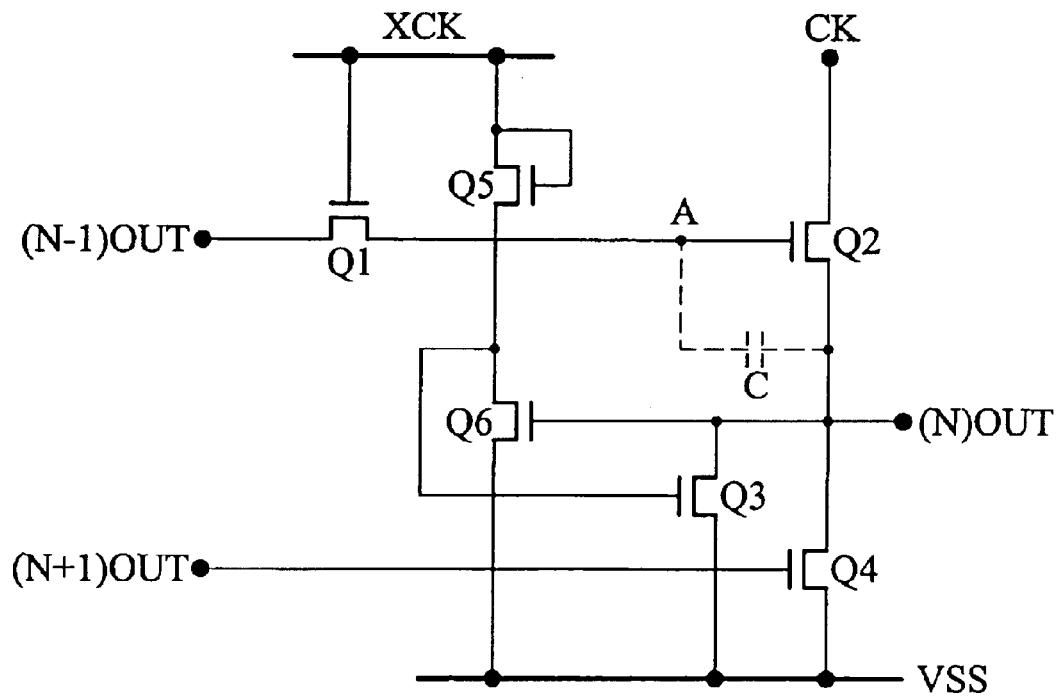
FIG. 8 shows a circuit of the shift-register unit according to the sixth embodiment of the present invention.

FIG. 8 shows a circuit of the shift-register unit according to the sixth embodiment of the present invention. As shown in FIG. 8, a fifth transistor Q5 and sixth transistor Q6 compose the inverse 20. The fifth transistor Q5 includes a gate and first source/drain coupled to the inverse clock signal XCK, and a second source/drain coupled to the gate of the third transistor Q3. The sixth transistor Q6 includes a gate coupled to the output terminal (N)OUT of the shift-register unit 2, a first source/drain coupled to the gate of the third transistor Q3, and a second source/drain coupled to the first voltage VSS.

Figure 9:
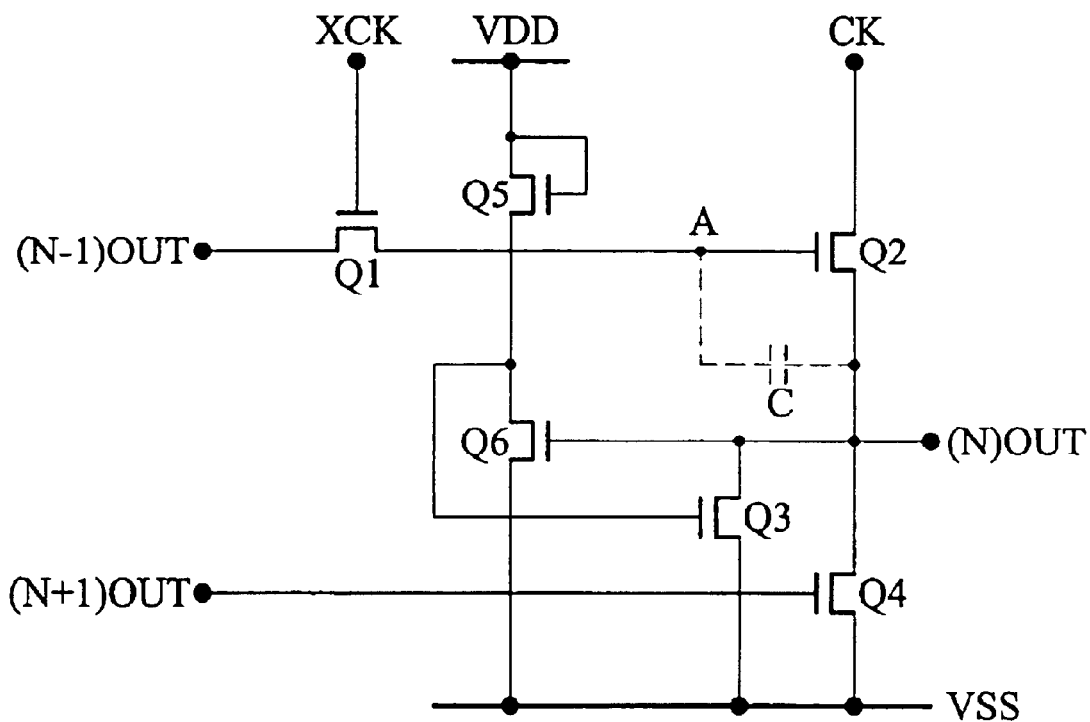
FIG. 9 shows a circuit of the shift-register unit according to the seventh embodiment of the present invention.

FIG. 9 shows a circuit of the shift-register unit according to the seventh embodiment of the present invention. The difference between the seventh embodiment and sixth embodiment of the present invention is the gate and first source/drain of the fifth transistor Q5 of the seventh embodiment is coupled to the second voltage VDD and the gate of the first transistor Q1 is coupled to the inverse clock signal XCK.

Figure 10:
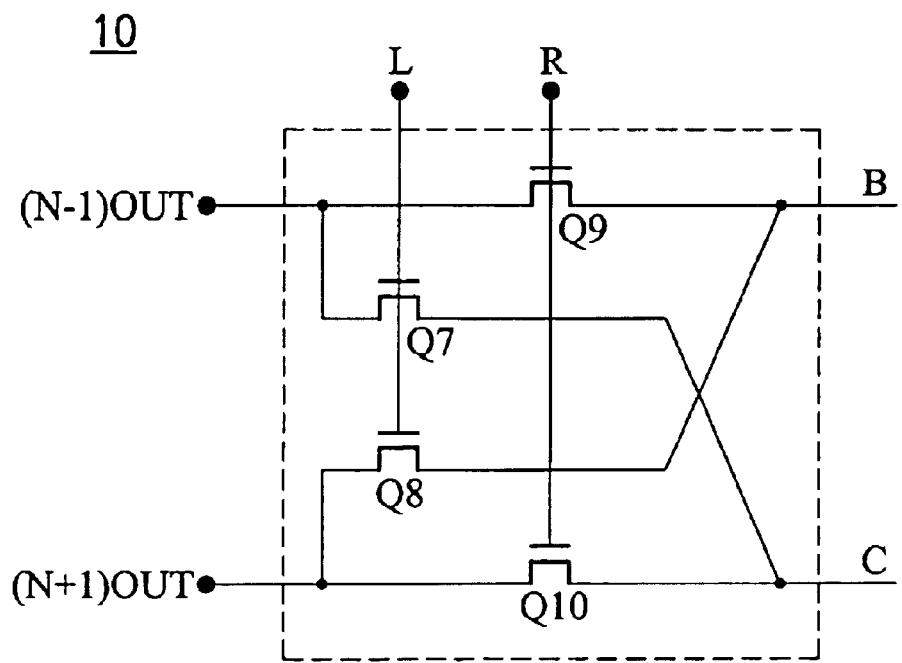
FIG. 10 shows a control circuit regulating the transmission direction of the shift-register unit according to the present invention.

FIG. 10 shows a control circuit regulating the transmission direction of the shift-register unit according to the present invention. As shown in FIG. 10, the transistors Q7~Q10 comprise the control circuit 10. The seventh transistor Q7 includes a gate coupled to a left signal L directing the output signal of the shift-register circuit leftward, that is, the output signal is transmitted to the previous-stage shift-register unit, a first source/drain is coupled to the output terminal (N−1)OUT of the previous-stage shift-register unit, and a second source/drain is coupled to a point C. The eighth transistor Q8 includes a gate coupled to a left signal L, a first source/drain coupled to the output terminal (N+1)OUT of the next-stage shift-register unit, and a second source/drain coupled to a point B.

The ninth transistor Q9 includes a gate coupled to a right signal R to direct the output signal of the shift-register circuit rightward, a first source/drain coupled to the output terminal (N−1)OUT of the previous-stage shift-register unit, and a second source/drain coupled to point B. The tenth transistor Q10 includes a gate coupled to the right signal R, a first source/drain coupled to the output terminal (N+1) OUT of the next-stage shift-register unit, and a second source/drain coupled to the point C.

The control circuit 10 can be used in any embodiment of the present invention. When each shift-register unit connects to the control circuit 10, the direction of the output signal of the shift-register circuit is determined. The control circuit 10 connects to the shift-register unit as follows.

In FIG. 9, the point B of the control circuit 10 is coupled to the output terminal (N−1)OUT of the previous-stage shift-register unit and the point C of the control circuit 10 is coupled to the output terminal (N+1)OUT of the next-stage shift-register unit.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A shift-register circuit having a plurality of shift-register units connected in serial enabling transmission of a clock signal, an inverse clock signal, and a first voltage, each of the shift-register units comprising:

a first transistor having a gate coupled to the inverse clock signal and a first source/drain coupled to a signal output from a previous-stage shift-register unit;

an inverter having a first input terminal coupled to the first source/drain of the first transistor;

a second transistor having a gate coupled to a second source/drain of the first transistor and a first source/drain coupled to the clock signal and a second source/drain coupled to an output terminal;

a third transistor having a gate coupled to a first output terminal of the inverter and a first source/drain coupled to the output terminal and a second source/drain coupled to the first voltage; and a fourth transistor having a gate coupled to a signal output from a next-stage shift-register unit and a first source/drain coupled to the output terminal and a second source/drain coupled to the first voltage.

2. The shift-register circuit as claimed in claim 1, wherein the inverter comprises:

a fifth transistor having a gate and first source/drain coupled to the inverse clock signal and a second source/drain coupled to the gate of the third transistor; and a sixth transistor having a gate coupled to the first source/drain of the first transistor and a first source/drain coupled to the gate of the third transistor and a second source/drain coupled to the first voltage.

3. The shift-register circuit as claimed in claim 1, further comprising; a first capacitor connected between the gate and second source/drain of the second transistor.

4. The shift-register circuit as claimed in claim 1, wherein the transistors are MOS thin film transistors.

5. The shift-register circuit as claimed in claim 2, wherein the transistors are MOS thin film transistors.

6. A shift-register circuit having a plurality of shift-register units connected in serial enabling transmission of a clock signal, an inverse clock signal, and a first voltage, each of the shift-register units comprising:

a first transistor having a gate coupled to the inverse clock signal and a first source/drain coupled to a signal output from a previous-stage shift-register unit;

a second transistor having a gate coupled to a second source/drain of the first transistor and a first source/ drain coupled to the clock signal and a second source/drain coupled to an output terminal;

an inverter having a first input terminal coupled to the output terminal;

a third transistor having a gate coupled to a first output terminal of the inverter and a first source/drain coupled to the output terminal and a second source/drain coupled to the first voltage; and a fourth transistor having a gate coupled to a signal output from a next-stage shift-register unit and a first source/drain coupled to the output terminal and a second source/drain coupled to the first voltage.

7. The shift-register circuit as claimed in claim 6, wherein the inverter comprises:

a fifth transistor having a gate and first source/drain coupled to a trigger signal and a second source/drain coupled to the gate of the third transistor; and a sixth transistor having a gate coupled to the output terminal and a first source/drain coupled to the gate of the third transistor and a second source/drain coupled to the first voltage.

8. The shift-register circuit as claimed in claim 7, wherein the trigger signal is the inverse clock signal.

9. The shift-register circuit as claimed in claim 7, wherein the trigger signal is a second voltage and the level of the second voltage is more than the level of the first voltage.

10. The shift-register circuit as claimed in claim 6, further comprising; a first capacitor connected between the gate and second source/drain of the second transistor.

11. The shift-register circuit as claimed in claim 6, wherein the transistors are MOS thin film transistors.

12. The shift-register circuit as claimed in claim 7, wherein the transistors are MOS thin film transistors.

13. A shift-register circuit having a plurality of shift-register units connected in serial enabling transmission of a clock signal, an inverse clock signal, and a first voltage, each of the shift-register units comprising:

a first transistor having a gate coupled to the inverse clock signal and a first source/drain coupled to a trigger terminal;

an inverter having a first input terminal coupled to the first source/drain of the first transistor;

a second transistor having a gate coupled to a second source/drain of the first transistor and a first source/drain coupled to the clock signal and a second source/drain coupled to an output terminal for outputting signals;

a third transistor having a gate coupled to a first output terminal of the inverter and a first source/drain coupled to the output terminal and a second source/drain coupled to the first voltage;

a fourth transistor having a gate coupled to a reset terminal and a first source/drain coupled to the output terminal and a second source/drain coupled to the first voltage; and a control device for regulating the direction of the output signals, comprising:

a seventh transistor having a gate coupled to a left signal directing the output signal of the shift-register circuit leftward and a first source/drain coupled to a signal output from a previous-stage shift-register unit and a second source/drain coupled to the reset terminal;

a eighth transistor having a gate coupled to the left signal and a first source/drain coupled to a signal output from a next-stage shift-register unit and a second source/drain coupled to the trigger terminal;

a ninth transistor having a gate coupled to a right signal for directing the output signal rightward and a first source/drain coupled to the output signal output from the previous-stage shift-register unit and a second source/drain coupled to the trigger terminal; and a tenth transistor having a gate coupled to the right signal and a first source/drain coupled to the output signal output from the next-stage shift-register unit and a second source/drain coupled to the reset terminal.

14. The shift-register circuit as claimed in claim 13, wherein the inverter comprises:

a fifth transistor having a gate and first source/drain coupled to the inverse clock signal and a second source/drain coupled to the gate of the third transistor; and a sixth transistor having a gate coupled to the first source/drain of the first transistor and a first source/drain coupled to the gate of the third transistor and a second source/drain coupled to the first voltage.

15. The shift-register circuit as claimed in claim 14, wherein the transistors are MOS thin film transistors.

16. A shift-register circuit having a plurality of shift-register units connected in serial enabling transmission of a clock signal, an inverse clock signal, and a first voltage, each of the shift-register units comprising:

a first transistor having a gate coupled to the inverse clock signal and a first source/drain coupled to a trigger terminal;

a second transistor having a gate coupled to a second source/drain of the first transistor and a first source/drain coupled to the clock signal and a second source/drain coupled to an output terminal for outputting signals;

an inverter having a first input terminal coupled to the output terminal;

a third transistor having a gate coupled to a first output terminal of the inverter and a first source/drain coupled to the output terminal and a second source/drain coupled to the first voltage;

a fourth transistor having a gate coupled to a reset terminal and a first source/drain coupled to the output terminal and a second source/drain coupled to the first voltage; and a control device for controlling the direction of the output signals, comprising:

a seventh transistor having a gate coupled to a left signal directing the output signal of the shift-register circuit leftward and a first source/drain coupled to a signal output from a previous-stage shift-register unit and a second source/drain coupled to the reset terminal;

a eighth transistor having a gate coupled to the left signal and a first source/drain coupled to a signal output from a next-stage shift-register unit and a second source/drain coupled to the trigger terminal;

a ninth transistor having a gate coupled to a right signal for directing the output signal rightward and a first source/drain coupled to the output signal output from the previous-stage shift-register unit and a second source/drain coupled to the trigger terminal; and a tenth transistor having a gate coupled to the right signal and a first source/drain coupled to the output signal output from the next-stage shift-register unit and a second source/drain coupled to the reset terminal.

17. The shift-register circuit as claimed in claim 16, wherein the inverter comprises:

a fifth transistor having a gate and first source/drain coupled to a trigger signal and a second source/drain coupled to the gate of the third transistor; and a sixth transistor having a gate coupled to the output terminal and a first source/drain coupled to the gate of the third transistor and a second source/drain coupled to the first voltage.

18. The shift-register circuit as claimed in claim 17, wherein the trigger signal is the inverse clock signal.

19. The shift-register circuit as claimed in claim 18, wherein the trigger signal is a second voltage and the level of the second voltage is more than the level of the first voltage.

20. The shift-register circuit as claimed in claim 16, wherein the transistors are MOS thin film transistors.

21. The shift-register circuit as claimed in claim 17, wherein the transistors are MOS thin film transistors.

* * * * *